United States Patent [19]

Israel

[11] 4,142,082
[45] Feb. 27, 1979

[54] HIGH FREQUENCY POWER SUPPLY MICROWAVE OVEN

[75] Inventor: Henry M. Israel, Worcester, Mass.

[73] Assignee: Raytheon Company, Lexington, Mass.

[21] Appl. No.: 810,541

[22] Filed: Jun. 27, 1977

Related U.S. Application Data

[63] Continuation of Ser. No. 641,794, Dec. 18, 1975, abandoned.

[51] Int. Cl.² ............................................. H05B 9/06
[52] U.S. Cl. ................................. 219/10.55 B; 323/17
[58] Field of Search .................... 219/10.55 B; 323/6, 323/17, 45, 62; 331/86, 87; 328/253, 267, 258, 66; 315/276, 283

[56] References Cited

U.S. PATENT DOCUMENTS

| | | | |
|---|---|---|---|
| 2,919,414 | 12/1959 | Neitzert | 331/87 |
| 3,374,443 | 3/1968 | Braum et al. | 331/87 |
| 3,611,211 | 10/1971 | Theodore | 331/87 |
| 3,671,847 | 6/1972 | Shiband | 219/10.55 B |
| 3,710,065 | 1/1973 | Crapuchettes | 219/10.55 B |
| 3,740,640 | 6/1973 | Ravas et al. | 323/17 |
| 3,780,252 | 12/1973 | Crapuchettes | 219/10.55 B |
| 3,889,173 | 6/1975 | Klusmann et al. | 323/17 X |
| 3,902,099 | 8/1975 | Feinberg | 323/61 X |
| 3,973,165 | 8/1976 | Hester | 331/87 X |

*Primary Examiner*—Arthur T. Grimley
*Attorney, Agent, or Firm*—M. D. Bartlett; J. D. Pannone; H. W. Arnold

[57] ABSTRACT

A microwave oven having a magnetron wave energy supply energized by high voltage pulses at a superaudible frequency wherein the voltage pulses are produced by a decreasing portion of a magnetic flux cycle of said frequency in a transformer added to a voltage on a capacitance whose charge is replenished during a portion of said cycle during which a semiconductor switch connects a winding of the transformer to a source of unidirectional voltage to increase the flux in the transformer thereby energizing the magnetron with voltage pulses from a supply having a substantially constant current characteristic and permitting variation of the constant current level by variation of the average flux density in the transformer.

10 Claims, 9 Drawing Figures

HIGH FREQUENCY POWER SUPPLY MICROWAVE OVEN

CROSS-REFERENCE TO RELATED CASES

This is a continuation of application Ser. No. 641,794, filed Dec. 18, 1975 now abandoned.

BACKGROUND OF THE INVENTION

Microwave ovens have generally been energized with microwave energy from magnetrons which require high voltage power supplies, and since such magnetrons are substantially constant voltage devices requiring several thousand volts, power supplies preferably should deliver power at voltage and current levels which produce operation of such magnetrons in a particular mode substantially independent of a wide range of microwave loads positioned in a cavity and in a region of high efficiency of the magnetron. Such power supplies have generally operated with 60-cycle transformers, with the desired regulation of current being produced by resonating action or with complex regulating structures which vary the magnetic field applied to the magnetron as a function of the space current through the magnetron. Such devices are bulky and heavy. In addition, control of such circuits to regulate or to vary the average microwave power of the oven requires relatively complicated controls.

SUMMARY OF THE INVENTION

In accordance with this invention, a microwave oven is supplied with microwave energy from a microwave generator in which at least a substantial portion of the input power to the microwave generator is derived from a magnetic field whose strength is decreasing during operation of said generator thereby providing a substantial portion of the power to said microwave generator as a drive having a substantially constant current characteristic. More specifically, such a decreasing magnetic field provides sufficient induced voltage in an output winding to energize a microwave generator such as a magnetron independent of variations in the high voltage requirements of said magnetron which may be due to, for example, manufacturing tolerances, changes in the microwave load, changes in the cathode emission characteristics of the tube throughout its life, and/or changes in the transverse magnetic field of the magnetron.

This invention further discloses that the energy for supplying the pulse of current to the microwave generator, such as a magnetron, may be stored in the magnetizing reactance in the form of exciting current in a transformer. In addition, a charge may be stored in a high voltage condenser or energy storage network during the same time that energy is being added to the transformer to increase the magnetic flux therein and such a charge may be subsequently fed in series with the pulse produced by the decreasing transformer magnetic flux to form a composite power drive to the magnetron.

More specifically, a primary winding is supplied from an unregulated power supply through a semiconductor switch which is cyclically turned on and off. When the semiconductor switch is on, a voltage is applied across said primary winding from said unregulated power supply and the magnetic flux in said transformer increases producing a high voltage in an output winding which charges an energy storage system such as, for example, a capacitor. When the semiconductor switch is turned off, the polarity of the voltage across said output winding reverses and is added in series with the voltage stored in said energy storage system to supply a pulse, for example a negative pulse, to the cathode of a magnetron whose anode is grounded. The time duration during which said switch is off and energy is supplied to the magnetron may be greater than the time duration when the switch is on and adds power to the transformer so that the output duty cycle is greater than fifty percent. The terms "on period" and "off period", as used throughout the specification and claims, mean the periods when the semiconductor switch is respectively closed and open.

This invention further provides for limiting the induced voltage in the output winding in the event that the load presents an open circuit. More specifically, an additional or over voltage winding is provided on the transformer which is connected in series with a rectifier across the power supply, with both said winding and said rectifier being poled to deliver current back to the unregulated power supply when the semiconductor switch is opened and the voltage across said switch exceeds a predetermined value. More specifically, if the load presents an open circuit due, for example, to failure of the heater or loss of emission of the magnetron cathode, an excessive voltage, which would otherwise appear across the semiconductor switch, is prevented.

This invention further discloses that by selecting the over voltage winding ratio, power may be fed back to the power supply for a short period following opening of the switch on each cycle prior to the time that power fed to the load has built up to a sufficient level overcoming the inductive reactance of the transformer leakage inductance thereby conserving power in switching transient spikes.

This invention further discloses that by maintaining the flux in the transformer above a predetermined value, variations in the peak load current, for example, through the magnetron will produce a shift in the average value of said flux to counteract said variations thereby stabilizing said load current.

This invention further discloses that by varying the width of the current pulse through the semiconductor switch, the average level of the magnetic flux in the transformer may be varied thereby varying the magnitude of the current delivered to the magnetron.

Further in accordance with this invention, variation of the current pulse width may be achieved in accordance with any desired program to vary or modulate the power supplied to the oven in accordance with any desired sequence.

In addition, the major portion of the current waveform through the semiconductor switch may have a substantially rectangular component so that for a given power level, peak currents are reduced. More specifically, since the magnitude of the current through the semiconductor switch when it is turned on is a function of the magnitude of the magnetic flux in the transformer, the semiconductor switch may be turned fully on and fully off thereby reducing losses in the switch.

This invention further discloses that the circuit connecting the magnetron to the transformer output winding may be disabled during the time the semiconductor switch is on and charging the high voltage condenser and subsequently rendered conductive when the semiconductor switch is off. The capacitive reactance of the magnetron and associated filter components preferably resonates with the leakage inductance of the transformer and/or other inductive components at a predominant frequency during conduction of the magnetron which is higher than the predominant resonant frequency of the inductive reactance of the leakage inductance with the capacitive reactance of the high voltage charge storage condenser when the semiconductor switch is on.

This invention further provides for sensing the current through the switch, turning off the switch if the current therethrough exceeds predetermined limits.

BRIEF DESCRIPTION OF THE DRAWINGS

Other and further objects and advantages of the invention will become apparent as the description thereof progresses, reference being had to the accompanying drawings wherein.

DESCRIPTION OF THE PREFERRED EMBODIMENT

Figure 1:
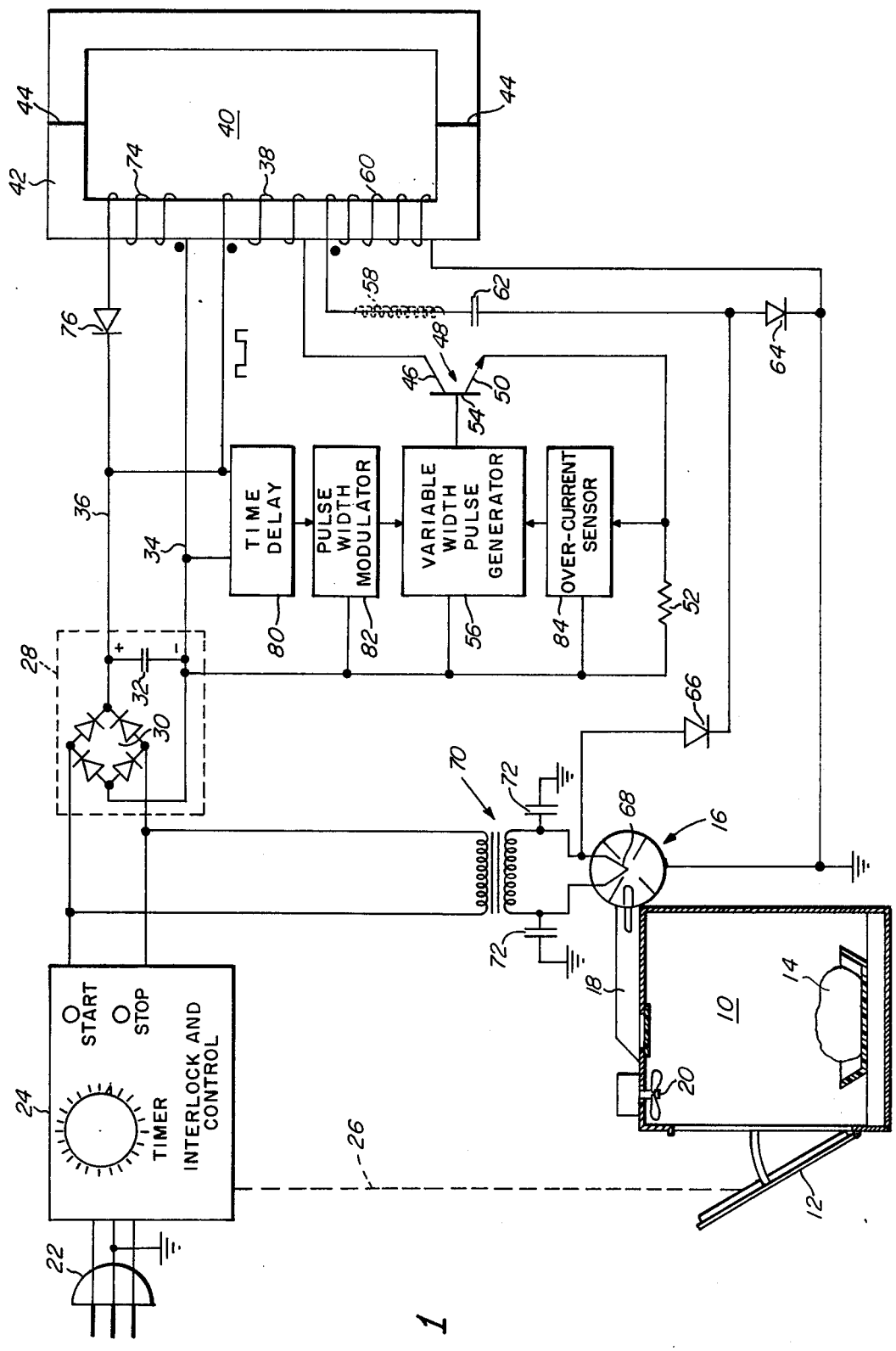
FIG. 1 illustrates a microwave oven system incorporating a superaudible frequency switching power supply and illustrating an embodiment of the invention.
Figure 2:
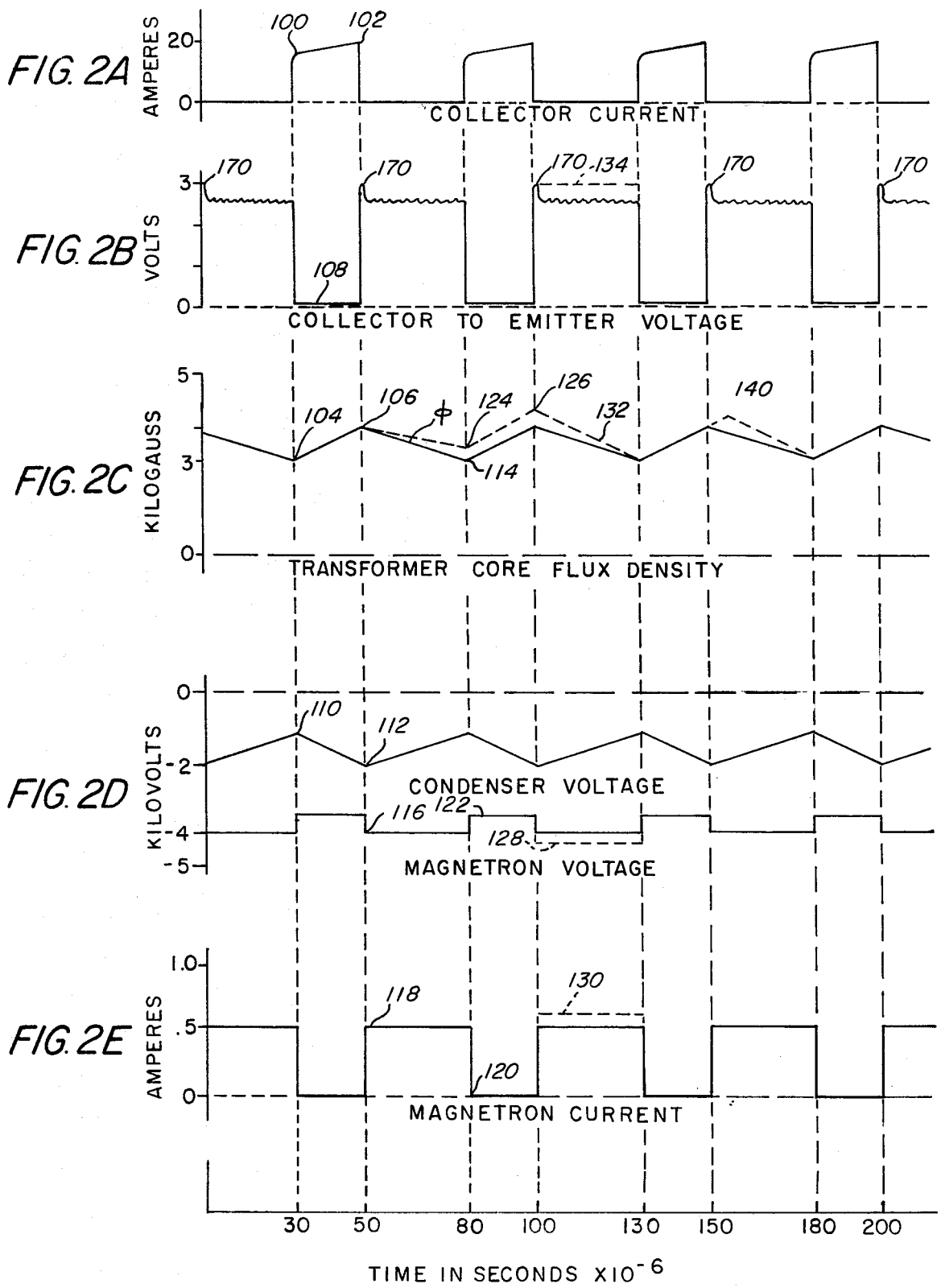
FIGS. 2A through 2F are examples of wave shapes illustrating features of the invention embodied in FIG. 1.

Referring now to FIG. 1, there is shown a microwave oven comprising a heating cavity 10 having a door 12 containing a body of food 14 to be heated with microwave energy. Cavity 10 is supplied with microwave energy from a magnetron 16 via a waveguide 18. The interior dimensions of cavity 10 are substantially greater than a free space wavelength of the frequency, for example, of 2450 MHz of the microwave energy produced by magnetron 16, and the resultant resonant modes in cavity 10 are cyclically varied by a mode stirrer 20 in accordance with well-known practice.

To energize the magnetron, power is supplied to the oven from a source of alternating current such as 115 volts 60 cycles through a plug 22 to an interlock and control circuit 24 which includes one or more interlock switches actuated through a mechanical linkage 26 closure of the door 12. Interlock and control circuit 24 may be of any desired type and, preferably, includes start and stop buttons and a settable cooking timer. Closure of door 12, setting the time and pushing the start button supplies power from the power source to low voltage power supply 28 consisting of, for example, a bridge rectifier 30 and an output filter capacitor 32 of sufficient size to provide an unregulated output voltage of 150 volts.

As illustrated herein, a center prong of plug 22 is grounded to a physical ground which is the same physical ground as the anode of magnetron 16. However, the negative side of condenser 32 is preferably connected to a floating ground bus 34 to reduce shock hazard, and the positive side of condenser 32 is connected to a positive bus 36.

Bus 36 is connected to one end of a first winding 38 of a transformer 40 having a core 42 which preferably may be of a ceramic material and which has an effective air gap such as gap or gaps 44 therein to prevent flux saturation of the core 42. The other end of winding 38 is connected to the collector 46 of a power transistor 48 whose emitter 50 is connected to bus 34 through a current sensing resistor 52.

The base 54 of transistor 48 is cyclically driven positive with respect to emitter 50 by a pulse generator driver 56 which generates positive going rectangular pulses of, for example, twenty microseconds duration at a repetition rate of, for example, twenty kilohertz. Pulse generator 56 is energized and controlled in a manner to be described presently.

A second winding 60 of transformer 40 is a high voltage power output winding, one end of which is connected to ground and, hence, to the anode of magnetron 16. The other end of winding 60 is connected through an output storage condenser 62 and a high voltage rectifier 64 to ground, rectifier 64 being poled so that current flows from positive to negative through rectifier 64 to ground. The junction between condenser 62 and rectifier 64 is connected through a second high voltage rectifier 66 to the cathode heater 68 of magnetron 16 with rectifier 66 being poled such that current flows from cathode heater 68 to condenser 62. If desired, rectifier 66 may be omitted and condenser 62 connected directly to cathode heater 68 as described hereinafter.

Heater power is supplied to cathode heater 68 by the secondary winding of a cathode heater transformer 70 whose primary is supplied by the output from control circuit 24. Filter condensers 72 are connected from each side of the cathode heater 68 to ground to suppress microwave energy or other radiation emanating from the leads of cathode heater 68.

A third winding 74 of transformer 40 has one end connected to bus 34 and the other end connected through a rectifier 76 to bus 36, rectifier 76 being poled such that current may flow from winding 74 through rectifier 76 to bus 36. The polarity and turns ratios between windings 74 and 38 are preferably selected to feed power back to the power supply 28 when switch 48 is switched off and no power is delivered to the load. Such a turns ratio is, for example, between 1:2 and 2:1.

Pulse generator 56 may be of any desired type, such as a multivibrator or a digitally timed circuit, which produces the desired output. Preferably, power is supplied to the pulse generator 56 from bus 36 through a time delay 80 which delays the application of power for three or four seconds from the time that power is applied to cathode heater transformer 70 to allow the magnetron cathode heater 68 to be heated to operating temperature, and during this period the transistor 48 remains off. Following the elapse of the time delay period, a pulse width modulator 82 senses the value of the voltage between buses 34 and 36 and supplies a voltage control signal to the pulse generator 56 to actuate generator 56 and to vary the width of the pulses from generator 56 as a function of the voltage between buses 34 and 36 so that the power supplied to the transformer 40 will remain relatively constant independent of fluctuations in line voltage including any power supply voltage ripple across condenser 32. Such a pulse width modulator may be either analog or digital in accordance with wellknown practice and may provide a pulse width variation control signal to generator 56 which varies as any desired function of changes in the voltage between buses 34 and 36 and can provide pulse width control for variation of the average microwave power supplied to the oven. In addition, provision may be made, if desired, for manual adjustment of the width of the pulses to adjust the power output of the magnetron 16.

An overcurrent sensor circuit 84 compares the amplitude of the voltage pulses across resistor 52 with a reference voltage, and if such pulses exceed a predetermined value, indicating overload conditions for the transistor 48, a control signal is sent to the pulse generator 56 to disable the pulse generator either until reset manually or, more preferably, for a predetermined time, such as one cycle, to allow time for the overload condition, such as voltage breakdown in a high voltage component on the magnetron, to cease, the pulse generator 56 then automatically resuming generation of pulses. Overcurrent sensor 84 may, if desired, be used to control the time delay 80 to reset the time delay or to disable the pulse width modulator 82 rather than being an independent disabling circuit as shown.

Preferably, the value of the leakage reactance illustrated by the dotted line 58 is selected to limit the peak charging current to condenser 62 when the transistor switch 48 is turned on thereby limiting the value of the peak current to a value above which overcurrent sensor 84 will disable pulse generator 56. Storage condenser 62 can then be sufficiently large that voltage across the condenser will discharge by a relatively small percentage, such as ten to twenty percent, of its voltage during conduction of the magnetron 16. Condenser 62 may have a value of, for example 0.05 to 0.2 microfarads and resonate with leakage reactance 58 at a relatively low frequency, for example, under 1000 hertz. However, when the voltage across winding 60 is reversed, diode 64 ceases to conduct and diode 66 conducts so that leakage reactance 58 now forms a different series resonant circuit in which condensers 72 are in series with condenser 62 and leakage reactance 58. When diode 76 is conducting, the resonant circuit of condensers 72 with condenser 62 and leakage reactance 58 is shunted by the circuit of winding 74, diode 76 and power supply condenser 32 until current through leakage reactance 58 builds up to a level which reduces the voltage across winding 74 below the power supply voltage. Condensers 72 and the associated capacitance of cathode heater transformer 70 preferably have a value in the region of from 500 to 2000 microfarads and, hence, will resonate with leakage reactance 58 at a very substantially higher frequency than the charging resonant frequency. Preferably, the leakage reactance 58 and associated circuitry resonates with the charge storage system represented by the capacitor 62 at less than 1000 hertz during charging of condenser 62 and resonates with the capacitive reactance of the output load of the magnetron 16, condensers 72, and other stray capacitance in series with condenser 62 at a frequency which is one or more orders of magnitude higher than the charging resonant frequency, and/or which is the same order of magnitude or a higher order of magnitude than the switching frequency of twenty kilohertz. Different values of leakage reactance 58 may be used depending upon the degree of shaping desired for the pulse supplied to the magnetron 16, and additional reactive components may, if desired, be inserted in the circuit to further shape the waveform or to suppress transients in accordance with well-known practice.

The diode 66 may be omitted, if desired, and the residual charge filter condensers 72, remaining after the magnetron ceases conducting, will discharge through condenser 62 and leakage reactance 58, aiding in rapid initial current buildup through switch 48 to improve the waveshape.

DESCRIPTION OF THE PREFERRED METHOD OF OPERATION

Referring now to FIGS. 2 through 4a, preferred method of operation of the system of FIG. 1 will be described. Power supplied to input plug 22 is controlled by the control system 24 when the door 12 is closed, mechanically closing the interlock system. The cooking time for the body of food 14 is selected by manually setting the time and the start button is pressed supplying power to the cathode heater 68 of magnetron 16 by a transformer 70 and to the bridge rectifier 30 charging power supply condenser 32 to approximately 150 volts. Pulse generator 56 and pulse width modulator 82 are energized through a conventional time delay 80 which has a delay of a few seconds to allow cathode heater 68 to be heated before pulse generator 56 becomes operative. Generator 54 supplies output pulses of, for example, approximately fifty to twenty microseconds duration to drive the base 54 of transistor 48 positive by voltage on the order of one-half volt to one volt with respect to its emitter 50, producing a current flow from base 54 to emitter 50 on the order of several amperes and a current flow from bus 36 through winding 38 and collector 46 of fifteen to twenty amperes as shown in FIG. 2A. Base current and collector current flow through current sensing resistor 52, which has a value of a fraction of an ohm, to bus 34.

The collector current 46 shown in FIG. 2A is a function of the flux produced in core 42 by current flow through winding 38 and after the first few pulses reaches a relatively steady cyclical operating region where turn-on current may be, for example, approximately fifteen amperes as shown by point 100 to begin the on period of transistor switch 48 and after the elapse of fifteen to twenty microseconds approaches eighteen amperes as shown by point 102, at which time the transistor base is lowered to a potential at, or slightly below, the potential of the emitter 50 and current through winding 38 ceases terminating said on period. During the on period the flux density in core 42 rises from a figure of, for example, 3000 gauss as shown by point 104 in FIG. 2C to a value of 4000 gauss as shown by point 106. During the on period the collector-to-emitter voltage of transistor 48, illustrated in FIG. 2B, drops to a value of, for example, one volt or less as shown by the region 108. FIG. 2D illustrates the cyclical variations in voltage across the high voltage condenser 62 and across magnetron 16. The voltage across condenser 62 may be, for example, 1500 volts at the beginning of the on period as shown by point 110 and increases to 1800 volts as shown by point 112 at the end of said on period thereby adding energy to condenser 62. The voltage produced across the winding 60 is selected by selecting the turns ratio between windings 38 and 60 and may be, for example, between 1:10 and 1:25. The current flow into condenser 62 during the on period flows through rectifier 64 thereby making the voltage across condenser 62 equal to the voltage across winding 60 during this portion of the cycle. Surges of current into and out of condenser 62, which might otherwise produce overload peak currents through transistor 48, are reduced to safe values by adjusting the leakage reactance between windings 60 and 38 to produce a leakage reactance indicated as the choke 58 in dotted lines between condenser 62 and winding 60.

At the end of the on period the voltage across both windings 38 and 60 reverses as the flux shown in FIG. 2C decreases at a rate determined by the current through winding 60 for a time period of thirty to thirty-five microseconds during which semiconductor switch 48 is off to point 114 of FIG. 2C, at which time switch 48 is again turned on, and during said off period the voltage across winding 60 applies a negative potential to condenser 62 which turns off diode 64 and drives magnetron 68 negative through diode 66 to a potential of, for example, 4000 volts as shown by point 116 of the curve labeled MAGNETRON VOLTAGE in FIG. 2D and producing a current flow in excess of one-half ampere through the magnetron 16 as shown by point 118 of FIG. 2E. The rise time to point 116 is determined primarily by the resonance of elements 58 and 72 and the voltage on winding 60 which is delivered by the voltage at which diode 76 conducts.

When switch 48 is again turned on at the end of the off period, the voltage in winding 60 again reverses and the magnetron current drops to zero as shown at point 120 while the voltage across magnetron 16 is reduced to a voltage which is below cutoff for the magnetron due to its transverse magnetic field as shown by point 122 of FIG. 2D. The remaining charge on condensers 72 and associated interelectrode capacitances including the interwinding capacitance of cathode filament transformer 70 maintains the voltage across magnetron 16 since discharge thereof back to condenser 62 is prevented by diode 66.

The magnetron voltage operating characteristic may shift, due to, for example, different loading in the oven, reduction of electron emission of the cathode from aging, changes in the the magnetic transverse field, substitution of another magnetron having slightly different operating characteristics, or line voltage variations. As a result, a smaller amount of power may be drawn during the magnetron conduction portion of the cycle, and the flux in the transformer 40 decreases at a lower rate as shown, for example, by the dotted line terminating at point 124. The current supplied through the transistor 48 during the next on period of the cycle would then raise the flux to a higher value than point 106 as shown, for example, by point 126, and the current drive applied to magnetron 16 during the off period increases, with the magnetron voltage being increased as shown by region 128 in FIG. 2D to produce substantially the original current through the magnetron. Similarly, if an increased flow of current through the magnetron 16 occurs as shown by the dotted line 130, the flux would then drop during this period at a higher rate, returning to the value of point 114 as shown by the dotted line 132 or going below point 114. Thus, it may be seen that the power supply output to the magnetron will produce a relatively constant output power level, substantially compensating for variations in the line voltage or in the load impedance.

Figure 3:
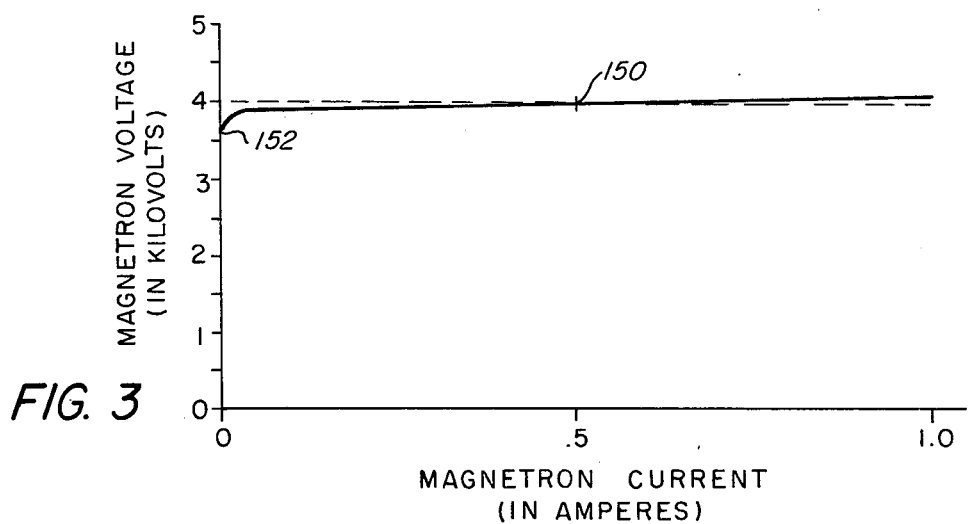
FIG. 3 illustrates a typical magnetron current voltage curve which may be used in the embodiment of FIGS. 1 and 2.

FIG. 3 illustrates a typical steady state voltage current curve of magnetron 16. A voltage power supply of about 4000 volts will energize the magnetron to operate with a current of about 0.5 amperes at point 150 during the transistor switch off period. During the transistor switch on period, capacitors 72 will rapidly discharge to around 3600 volts at point 152 where magnetron current is cut off by a transverse magnetic field. Since the current voltage curve of the magnetron is quite flat, the changes in the average flux in the transformer cause substantial changes in the magnetron current thereby permitting control of magnetron power by controlling the average value of the flux in the transformer.

Figure 4:
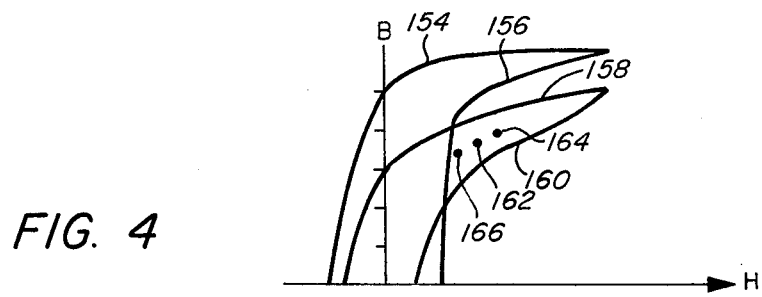
FIG. 4 illustrates transformer magnetic flux characteristics which may be used in the embodiment of the invention disclosed in FIGS. 1 through 3.

FIG. 4 shows a graph of magnetic flux B versus magneto-motive force H. Curves 154 and 156 are, respectively, the increasing and decreasing flux curves of a core without an air gap. Saturation of the core is avoided by inserting air gaps 44 in core 42 to produce curves 158 and 160 for, respectively, increasing and decreasing flux. The system may operate, for example, about an average flux value of 3300 gauss as shown by point 162. By varying the ratio of on to off periods of the transistor 48, the average flux point may be increased, for example, to point 164 or, for example, decreased to point 166 thereby increasing or decreasing the current supplied to magnetron 16. The curves of FIG. 4 are for positive portions since the flux in the core 42 is never reversed during normal operation of the system. The spacing between curves 158 and 160 is a function of core material and, preferably, is minimized to minimize core losses.

The total power supplied to the magnetron 16 for a given repetition rate of the current pulses through transistor 48 can be adjusted by changing the width of the pulses, for example, by manually adjusting a variable resistor of a conventional R-C timing circuit in pulse width modulator 82. Generally, such width is preferably set for the maximum efficiency of the overall system which depends upon the sizes of the components and the losses therein. Good results may be achieved with a duty cycle of current through transistor 48 of from twenty-five percent to seventy-five percent, dependent upon the characteristics of the magnetron used.

If desired, the width of the pulses may be modulated as a function of an external signal applied to modulator 82. More specifically, the pulse width may be varied as a function of the power supply voltage between buses 34 and 36 thereby compensating for power supply ripple or line voltage variations.

If a short circuit should appear in transformer 40 or the loads driven by windings 60 or 74 such that a peak current was drawn through transistor 48 for more than a predetermined time, the voltage developed across resistor 52 is sensed by overcurrent sensor 84 and shuts down the pulse generator 56. Such a shutdown may be manually or automatically reset after a predetermined time in accordance with well-known practice.

In the event that the magnetron 16 does not conduct during the transistor off period, or an open circuit occurs otherwise in the load connected to the winding 60, the voltage occurring across the transistor 48 during the off period would rise substantially above the 300 volts illustrated, for example, in region 134 of FIG. 2B. Accordingly, winding 74 is provided having a turns ratio selected to determine the maximum voltage which may be applied across transistor 48 for a given voltage power supply 28. For example, if the turns ratio of windings 38 and 74 is equal and power supply 28 has a voltage of 150 volts, then when the voltage across winding 38 reaches 150 volts, 300 volts will appear across transistor 48 and any increase in voltage across winding 74 will cause the flow of current through diode 76 to condenser 32 thereby preventing a further increase in the voltage across winding 38. Transient switching voltage spike 170 in FIG. 2B, which may exceed 300 volts at the beginning of the off period, is similarly limited by diode 76. The cooking process continues until the timer and control unit 24 de-energizes power supply 28, and the door 12 may then be opened to remove the heated food body 14.

DESCRIPTION OF AN ALTERNATE EMBODIMENT OF THE INVENTION

Figure 5:
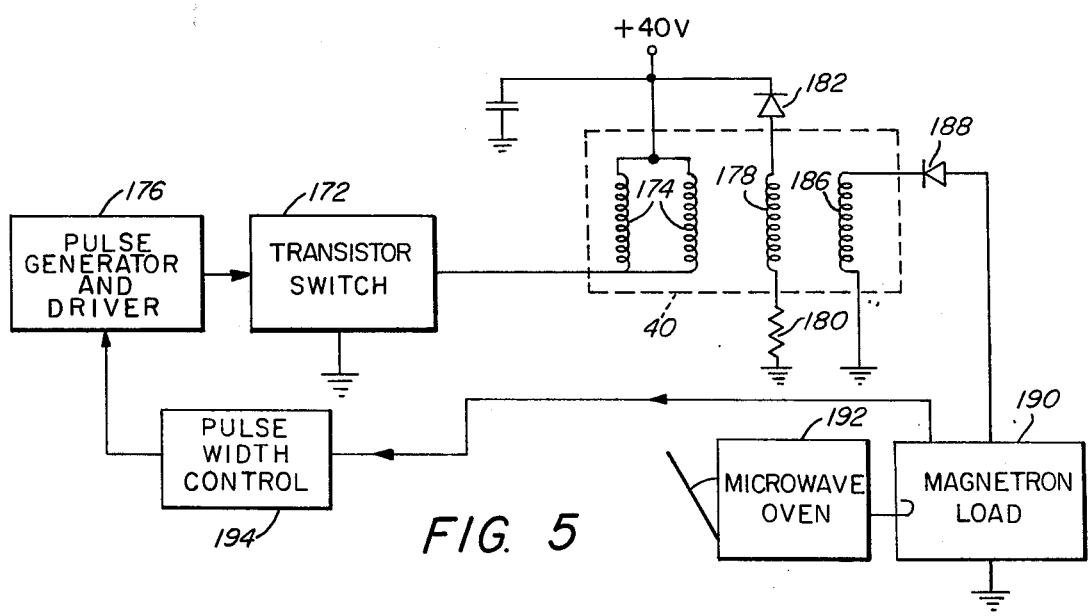
FIG. 5 discloses an alternate embodiment of the invention.

Referring now to FIG. 5, there is shown a further embodiment of the invention wherein the transistor switch 172 drives a pair of windings of a transformer 40 in parallel from a supply voltage of, for example, 40 volts when actuated by pulses from pulse control and driver 176. A third winding 178 is connected across windings 174 and transistor 172 and to ground through a resistor 180 and a diode 182. Winding 178 and diode 182 are poled to conduct when switch 172 is off thereby limiting the peak voltage across windings 174, 178 and a high voltage winding 186 during the off period. Winding 186 is connected through a diode 188 to a magnetron load 190 which may include filter condensers and magnetron current sensing circuitry. Magnetron load 190 supplies microwave energy to a microwave oven 192.

Winding 186 and diode 188 are poled to conduct during the transistor switch off period when the flux in transformer 40 is decreasing and a control signal derived from the current and/or voltage of the magnetron is supplied to pulse width control 194 to control the width of the pulses supplied to switch 172 at a twenty kilohertz rate to vary the time periods during which current is supplied to windings 174 thereby varying the average flux density in the core of transformer 40, hence varying the current supplied to magnetron load 190. The magnitude and sense of the signal supplied to control 194 are preferably selected to compensate for variations in microwave output power due, for example, to gradual discharge of a battery supplying the forty volts to windings 174 or to aging of the magnetron so that the average microwave power supplied to oven 192 is maintained relative constant. Such a system may also have features of FIG. 1 such as the timer and interlock control, the energy feedback of switching transient spikes to the power supply, and the high voltage energy storage systems and may also have any desired means of sensing the magnetron power output to control pulse generator 176.

This completes the description of the embodiment of the invention illustrated herein. However, many modifications thereof will be apparent to persons skilled in the art without departing from the spirit and scope of this invention. For example, other microwave generators, such as amplitrons or carcinotrons, could be used for the magnetron 16, other designs of the oven 10 could be used, and a large variety of digital programming systems can be used to control the pulse generator. In addition, sufficient capacitance can be provided across magnetron 16 to allow the magnetron to operate as a continuous wave device with a lower voltage and/or current level for a given average power output, and a wide range of shapes and sizes of transformer cores and windings can be used. Also, any pulse frequency can be used up to, for example, one hundred kilohertz, provided components having relatively low losses at these frequencies are employed. Accordingly, it is contemplated that this invention be not limited to the particular details illustrated herein except as defined by the appended claims.

What is claimed is:
1. In combination:
    a microwave oven supplied with microwave energy from a magnetron;
    a power supply for said magnetron comprising a transformer having a primary winding supplied with pulses of current from a source at a substantially constant superaudible repetition rate;
    a nonsaturating transformer having a magnetic core continuously flux biased in one direction with means for controlling the intensity of said current pulses comprising means for varying the average flux density in said core, said pulses of current being supplied to said primary winding when said magnetron is non-conductive to store energy in said core and cessation of each of said pulses producing a voltage in a secondary winding for supplying current to said magnetron.
2. The combination in accordance with claim 1 wherein said transformer has a ceramic core.
3. The combination in accordance with claim 1 wherein said coupling means comprises a storage condenser and a rectifier connected across an output winding of said transformer.
4. The combination in accordance with claim 3 wherein said coupling means comprises a second rectifier coupled in series with said magnetron and said condenser across said output winding.
5. The combination in accordance with claim 1 wherein said transformer comprises an input winding cyclically connected at a superaudible rate to a source of unidirectional voltage through a semiconductor switch.
6. A microwave oven comprising:
    a magnetron having its output coupled to the interior of said oven and its input supplied from a high voltage winding of a nonsaturating transformer having a core continuously flux biased in one direction;
    an input to said transformer comprising a primary winding connected to a source of power through a semiconductor switch which energizes said primary winding with pulses of current at a substantially constant superaudible pulse repetition rate;
    means for closing said switch to increase the flux energy stored in said transformer core to a predetermined value while charging a condenser through said high voltage winding and for opening said switch to deliver power to said magnetron from said condenser and said flux energy through said high voltage winding; and
    means for controlling the power supplied to said magnetron comprising means for varying the average density of said flux in said transformer.
7. The microwave oven in accordance with claim 6 wherein said means for varying the average density of said flux comprises means for varying the time duration of supply of current to said input winding.
8. The microwave oven in accordance with claim 6 wherein the decrease in said flux is cyclically terminated by cyclically closing said switch.
9. The microwave oven in accordance with claim 6 wherein said coupling means comprises means for coupling power in said transformer back to said power source when the voltage across said switch exceeds a predetermined value.
10. The microwave oven in accordance with claim 6 wherein said input to said magnetron is coupled to said transformer high voltage winding through a first rectifier and a condenser when said output winding voltage has one polarity and said output winding is decoupled from said magnetron and connected across said condenser and a second rectifier when said output winding voltage has the opposite polarity.

* * * * *